United States Patent
Kang

(10) Patent No.: US 8,379,475 B2
(45) Date of Patent: Feb. 19, 2013

(54) CLOCK CONTROL CIRCUIT AND CLOCK GENERATION CIRCUIT INCLUDING THE SAME

(75) Inventor: Tae Jin Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 312 days.

(21) Appl. No.: 12/824,864

(22) Filed: Jun. 28, 2010

(65) Prior Publication Data

US 2011/0158032 A1 Jun. 30, 2011

(30) Foreign Application Priority Data

Dec. 29, 2009 (KR) .................. 10-2009-0133238

(51) Int. Cl.
*G11C 8/00* (2006.01)
(52) U.S. Cl. .................................. 365/230.06
(58) Field of Classification Search ............ 365/230.06
See application file for complete search history.

(56) References Cited

U.S. PATENT DOCUMENTS

| 5,530,677 | A | 6/1996 | Grover et al. | |
|---|---|---|---|---|
| 6,333,886 | B2* | 12/2001 | Cho et al. | 365/222 |
| 2001/0000994 | A1* | 5/2001 | Tomita et al. | 365/233 |
| 2008/0301391 | A1* | 12/2008 | Oh | 711/167 |
| 2009/0046517 | A1* | 2/2009 | Taruishi et al. | 365/189.05 |

FOREIGN PATENT DOCUMENTS

| KR | 1020070035954 A | 4/2007 |
|---|---|---|
| KR | 1020080014544 A | 2/2008 |

* cited by examiner

*Primary Examiner* — Huan Hoang
*Assistant Examiner* — Min Huang
(74) *Attorney, Agent, or Firm* — Ladas & Parry LLP

(57) ABSTRACT

A clock control circuit is presented for reducing unnecessary current consumption. The clock control circuit includes a write enable signal generation unit and a clock enable signal generation unit. The write enable signal generation unit is configured to generate a first write enable signal, which is enabled during a predetermined time period after a write command is inputted, in response to first and second burst signals and a write signal including a pulse generated in response to the write command. The clock enable signal generation unit is configured to generate a clock enable signal, which is enabled during a write operation period, in response to the first write signal and the first write enable signal.

32 Claims, 11 Drawing Sheets

CLOCK CONTROL CIRCUIT AND CLOCK GENERATION CIRCUIT INCLUDING THE SAME

CROSS-REFERENCES TO RELATED APPLICATIONS

The present application claims priority under 35 U.S.C 119(a) to Korean application number 10-2009-0133238, filed on Dec. 29, 2009, in the Korean intellectual property Office, which is incorporated herein by reference in its entirety set forth in full.

BACKGROUND

Embodiments of the present invention relate to a semiconductor memory device, and more particularly, to a clock control circuit and a clock generation circuit including the same.

Synchronous memory devices refer to semiconductor memory devices which operate in synchronization with an external clock. Among the synchronous memory devices, a synchronous dynamic RAM (SDRAM) and a double data rate SDRAM (DDR SDRAM) are the mainstream in the markets of semiconductor memory devices.

A data input/output operation of an SDRAM is achieved by data access which is performed one time in synchronization with a rising edge of an external clock in each clock cycle. On the other hand, a data input/output operation of a DDR SDRAM is achieved by data access which is performed two times in each clock cycle. Each data access is performed in synchronization with rising and falling edges of an external clock through an internal circuit, called a delay locked loop (DLL) circuit.

As such, a data input/output operation of a synchronous memory device is performed in synchronization with an external clock. In the synchronous memory device, however, the data input/output operation synchronized with the external clock is practically performed even when a read or write operation is not performed, causing unnecessary current consumption.

SUMMARY

An embodiment of the present invention relates to a clock control circuit and a clock generation circuit including the same, which are capable of reducing unnecessary current consumption.

In one embodiment, a clock control circuit includes: a write enable signal generation unit configured to generate a first write enable signal, which is enabled during a predetermined time period after a write command is inputted, in response to first and second burst signals and a write signal including a pulse generated in response to the write command; and a clock enable signal generation unit configured to generate a clock enable signal, which is enabled during a write operation period, in response to the first write signal and the first write enable signal.

In another embodiment, a clock generation circuit includes: a command decoder configured to generate a first write signal in response to a write command; a mode register configured to store first and second burst signals including information on burst length; a clock control circuit configured to generate a clock enable signal which is enabled during a write operation period in response to the first write signal and the first and second burst signals; and a write clock generation unit configured to output an internal clock as a write clock in a time period in which the clock enable signal is enabled.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, specific embodiments of the present invention will be described with reference to the accompanying drawings. The drawings are not necessarily to scale and in some instances, proportions may have been exaggerated in order to clearly depict certain features of the invention.

Figure 1:
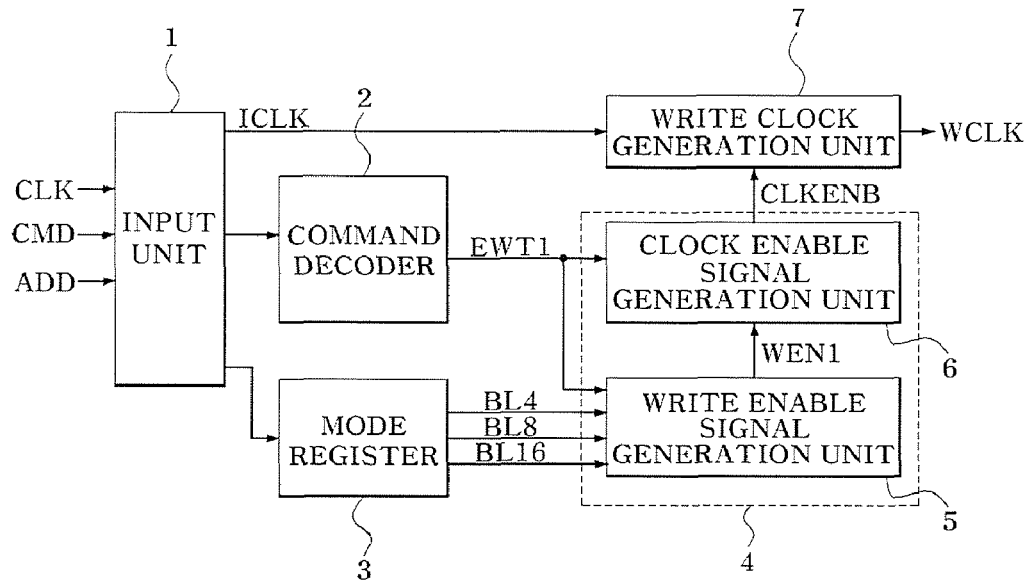
FIG. 1 is a block diagram of a clock generation circuit according to an embodiment of the present invention.

FIG. 1 is a block diagram of a clock generation circuit according to an embodiment of the present invention.

Referring to FIG. 1, a clock generation circuit according to an embodiment of the present invention includes an input unit 1, a command decoder 2, a mode register 3, a clock control circuit 4, and a write clock generation unit 7. The clock control circuit 4 includes a write enable signal generation unit 5 and a clock enable signal generation unit 6.

The command decoder 2 is configured to decode a command CMD received from the input unit 1, and generate a first write signal EWT1. The command decoder 2 is implemented with a known circuit and is configured to generate a pulse of the first write signal EWT1 when a write command WRITE is inputted in a write operation.

The mode register 3 is implemented with a known circuit and is configured to generate a first burst signal BL4, a second burst signal BL8, and a third burst signal BL16, which include information on burst length by a mode register set. The first burst signal BL4 is enabled to a high level when the burst length is set to 4, and the second burst signal BL8 is enabled to a high level when the burst length is set to 8. The third burst signal BL16 is enabled to a high level when the burst length is set to 16.

Figure 2:
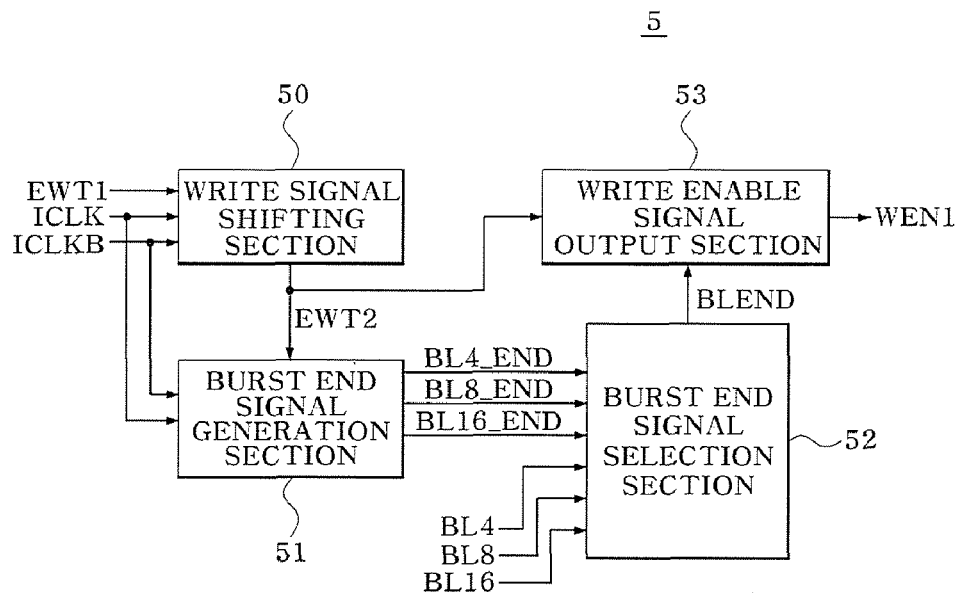
FIG. 2 is a block diagram of a write enable generation unit included in the clock generation circuit of FIG. 1.

As illustrated in FIG. 2, the write enable signal generation unit 5 includes a write signal shifting section 50, a burst end signal generation section 51, a burst end signal selection section 52, and a write enable signal output section 53.

Figure 3:
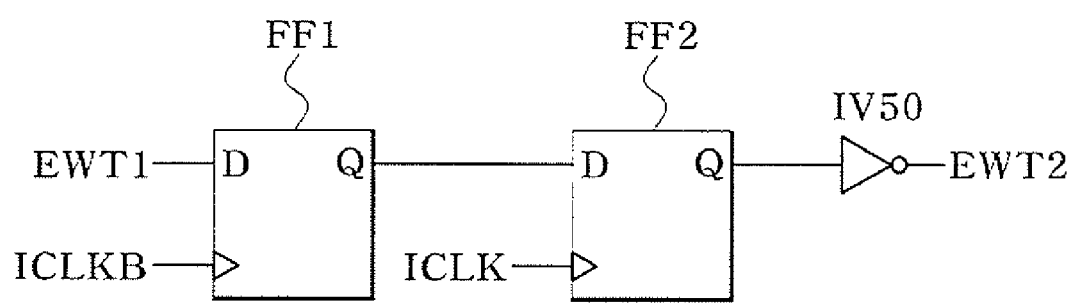
FIG. 3 is a circuit diagram of a write signal shifting section included in the write enable signal generation unit of FIG. 2.

As illustrated in FIG. 3, the write signal shifting section 50 includes a flip-flop FF1, a flip-flop FF2, and an inverter IV50. The flip-flop FF1 is configured to shift the first write signal EWT1 by a half cycle of an internal clock ICLK in synchronization with an inverted internal clock ICLKB. The flip-flop FF2 is configured to shift an output signal of the flip flop FF1 by a half cycle of the internal clock ICK in synchronization with the internal clock ICLK. The inverter IV50 is configured to invert and buffer an output signal of the flip-flop FF2 and output a second write signal EWT2. The write signal shifting section 50 configured as above shifts the first write signal EWT1 by one clock cycle of the internal clock ICLK, inverts the shifted first write signal EWT1, and outputs the second write signal EWT2.

Figure 4:
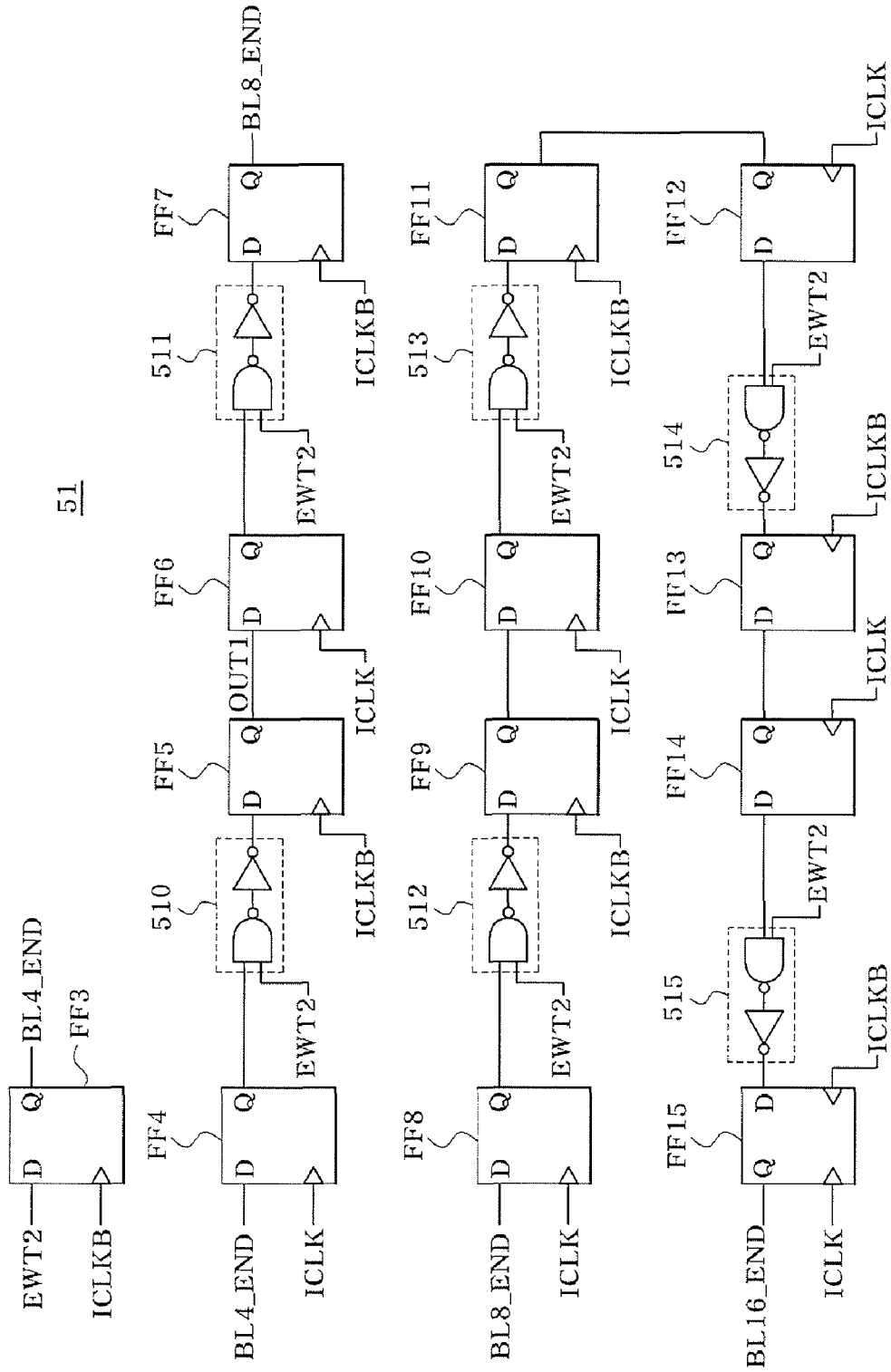
FIG. 4 is a circuit diagram of a burst end signal generation section included in the write enable signal generation unit of FIG. 2.

As illustrated in FIG. 4, the burst end signal generation section 51 includes a flip-flop FF3, a flip-flop FF4, a transfer element 510, a flip-flop FF5, a flip-flop FF6, a transfer element 511, and a flip-flop FF7. The flip-flop FF3 is configured to shift the second write signal EWT2 by a half cycle of the internal clock ICLK in synchronization with the inverted internal clock ICLKB, and output a first burst end signal BL4_END. The flip-flop FF4 is configured to shift an output signal of the flip-flop FF3 by a half cycle of the internal clock ICLK in synchronization with the internal clock ICLK. The transfer element 510 is configured to transfer an output signal of the flip-flop FF4 in a time period in which the second write signal EWT2 is at a high level. The flip-flop FF5 is configured to shift an output signal of the transfer element 510 by a half cycle of the internal clock ICLK in synchronization with the inverted internal clock ICLKB, and output a first output signal OUT1. The flip-flop FF6 is configured to shift the first output signal OUT1 by a half cycle of the internal clock ICLK in synchronization with the internal clock ICLK. The transfer element 511 is configured to transfer an output signal of the flip-flop FF6 in a time period in which the second write signal EWT2 is at a high level. The flip-flop FF7 is configured to shift an output signal of the transfer element 511 by a half cycle of the internal clock ICLK in synchronization with the inverted internal clock ICLKB, and output a second burst end signal BL8_END.

Also, the burst end signal generation section 51 includes a flip-flop FF8, a transfer element 512, a flip-flop FF9, a flip-flop FF10, a transfer element 513, a flip-flop FF11, a flip-flop FF12, a transfer element 514, a flip-flop FF13, a flip-flop FF14, a transfer element 515, and a flip-flop FF15. The flip-flop FF8 is configured to shift the second burst end signal BL8_END by a half cycle of the internal clock ICLK in synchronization with the internal clock ICLK. The transfer element 512 is configured to transfer an output signal of the flip-flop FF8 in a time period in which the second write signal EWT2 is at a high level. The flip-flop FF9 is configured to shift an output signal of the transfer element 512 by a half cycle of the internal clock ICLK in synchronization with the inverted internal clock ICLKB. The flip-flop FF10 is configured to shift an output signal of the flip-flop FF9 by a half cycle of the internal clock ICLK in synchronization with the internal clock ICLK. The transfer element 513 is configured to transfer an output signal of the flip-flop FF10 in a time period in which the second write signal EWT2 is at a high level. The flip-flop FF11 is configured to shift an output signal of the transfer element 513 by a half cycle of the internal clock ICLK in synchronization with the inverted internal clock ICLKB. The flip-flop FF12 is configured to shift an output signal of the flip-flop FF11 by a half cycle of the internal clock ICLK in synchronization with the internal clock ICLK. The transfer element 514 is configured to transfer an output signal of the flip-flop FF12 in a time period in which the write signal EWT2 is at a high level. The flip-flop FF13 is configured to shift an output signal of the transfer element 514 by a half cycle of the internal clock ICLK in synchronization with the inverted internal clock ICLKB. The flip-flop FF14 is configured to shift an output signal of the flip-flop FF13 by a half cycle of the internal clock ICLK in synchronization with the internal clock ICLK. The transfer element 515 is configured to transfer an output signal of the flip-flop FF14 in a time period in which the second write signal EWT2 is at a high level. The flip-flop FF15 is configured to shift an output signal of the transfer element 515 by a half cycle of the internal clock ICLK in synchronization with the inverted internal clock ICLKB and output a third burst end signal BL16_END.

The burst end signal generation section 51 configured as above generates the first burst end signal BL4_END by shifting the second write signal EWT2 by the half cycle of the internal clock ICLK, generates the second burst end signal BL8_END by shifting the first burst end signal BL4_END by two cycles of the internal clock ICLK, and generates the third burst end signal BL16_END by shifting the second burst end signal BL8_END by four cycles of the internal clock ICLK.

Figure 5:
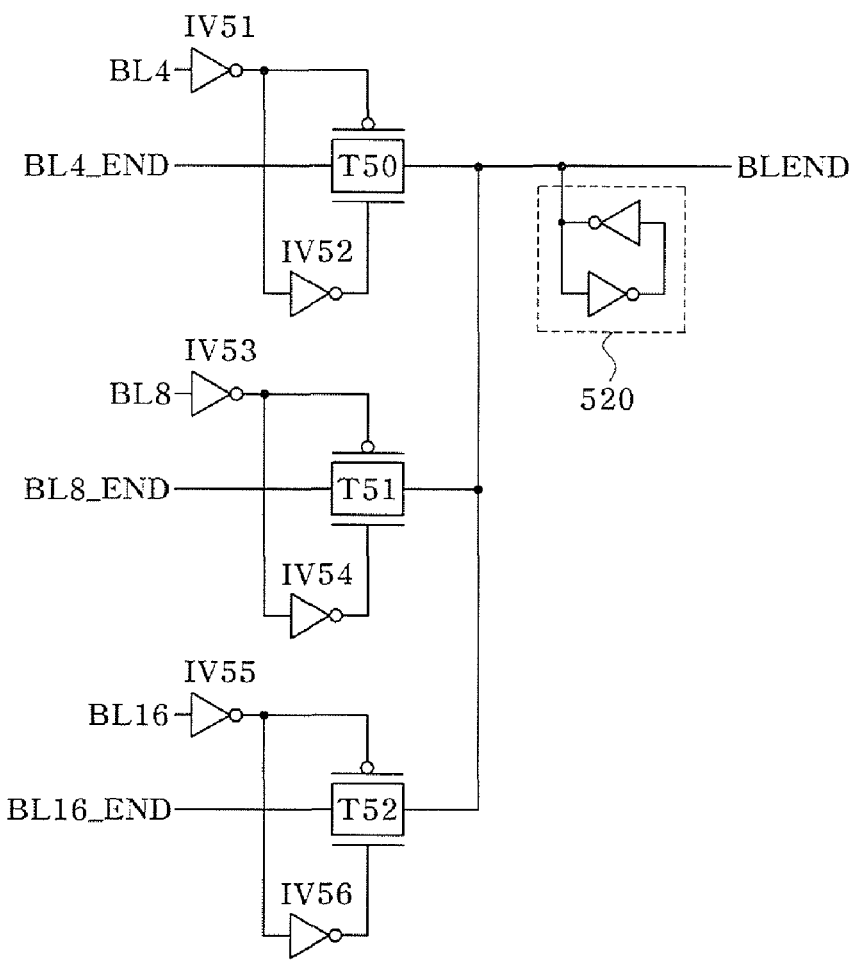
FIG. 5 is a circuit diagram of a write enable signal output section included in the write enable signal generation unit of FIG. 2.

As illustrated in FIG. 5, the burst end signal selection section 52 includes inverters IV51 to IV56, transfer gates T50 to T52, and a latch 520. The burst end signal selection section 52 configured as above outputs the first burst end signal BL4_END as an output burst end signal BLEND when the first burst signal BL4 is enabled to a high level, outputs the second burst end signal BL8_END as the output burst end signal BLEND when the second burst signal BL8 is enabled to a high level, and outputs the third burst end signal BL16_END as the output burst end signal BLEND when the third burst signal BL16 is enabled to a high level.

Figure 6:
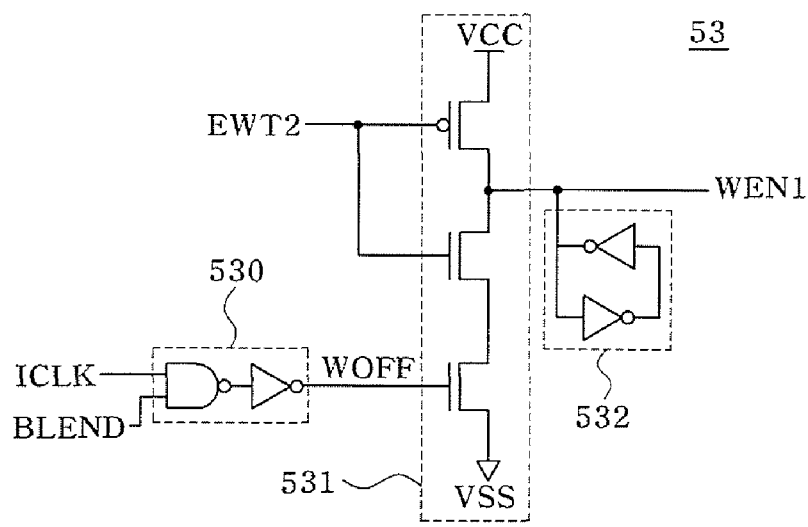
FIG. 6 is a circuit diagram of a burst end signal selection section included in the write enable signal generation unit of FIG. 2.

As illustrated in FIG. 6, the write enable signal output section 53 includes a transfer element 530, a driver 531, and a latch 532. The transfer element 530 is configured to buffer the output burst end signal BLEND and transfer the buffered signal as a write end signal WOFF in response to the internal clock ICLK. The driver 531 is configured to receive the second write signal EWT2 and the write end signal WOFF, and drive a first write enable signal WEN1. The latch 532 is configured to latch the first write enable signal WEN1 of an output node. The write enable signal output section 53 configured as above generates the first write enable signal WEN1 which is pull-up driven to a high level during a time period in which the second write signal EWT2 is enabled to a low level, and generates the first write enable signal WEN1 which is pull-down driven to a low level when the write end signal WOFF is enabled to a high level during a time period in which the second write signal EWT2 is disabled to a high level.

Figure 7:
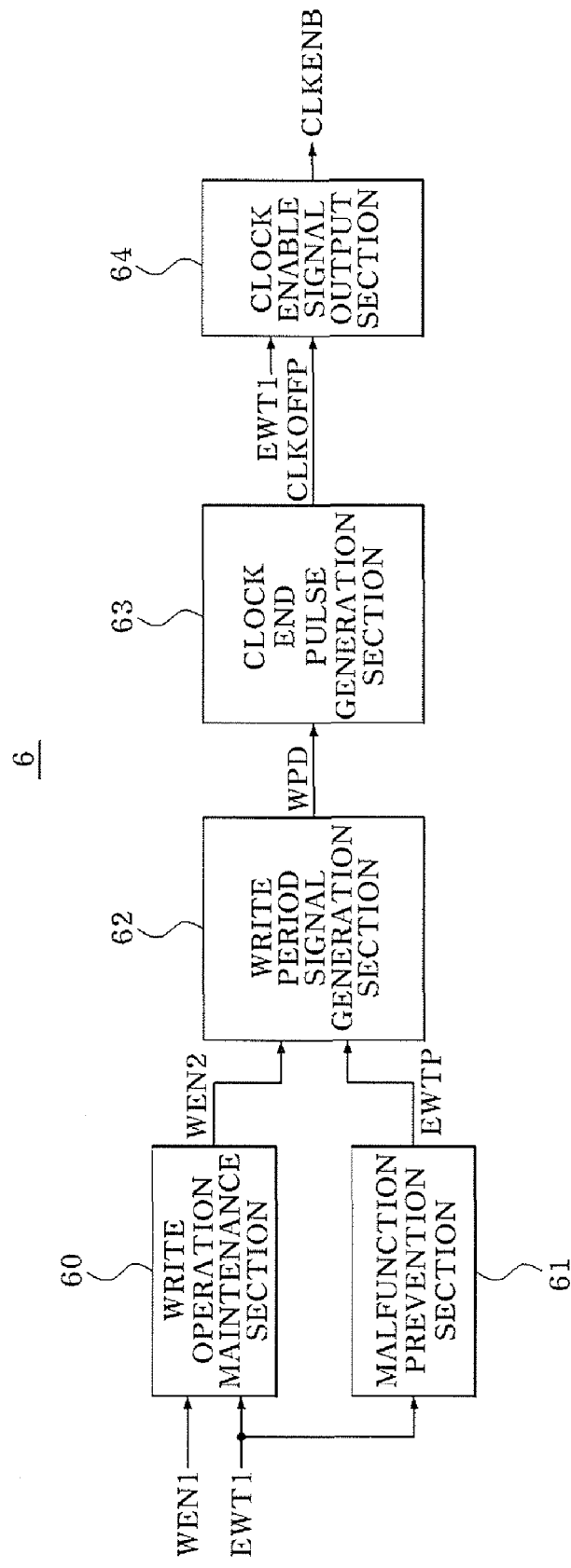
FIG. 7 is a block diagram of a clock enable signal generation unit included in the clock generation circuit of FIG. 1.

As illustrated in FIG. 7, the clock enable signal generation unit 6 includes a write operation maintenance section 60, a malfunction prevention section 61, a write period signal generation section 62, a clock end pulse generation section 63, and a clock enable signal output section 64.

Figure 8:
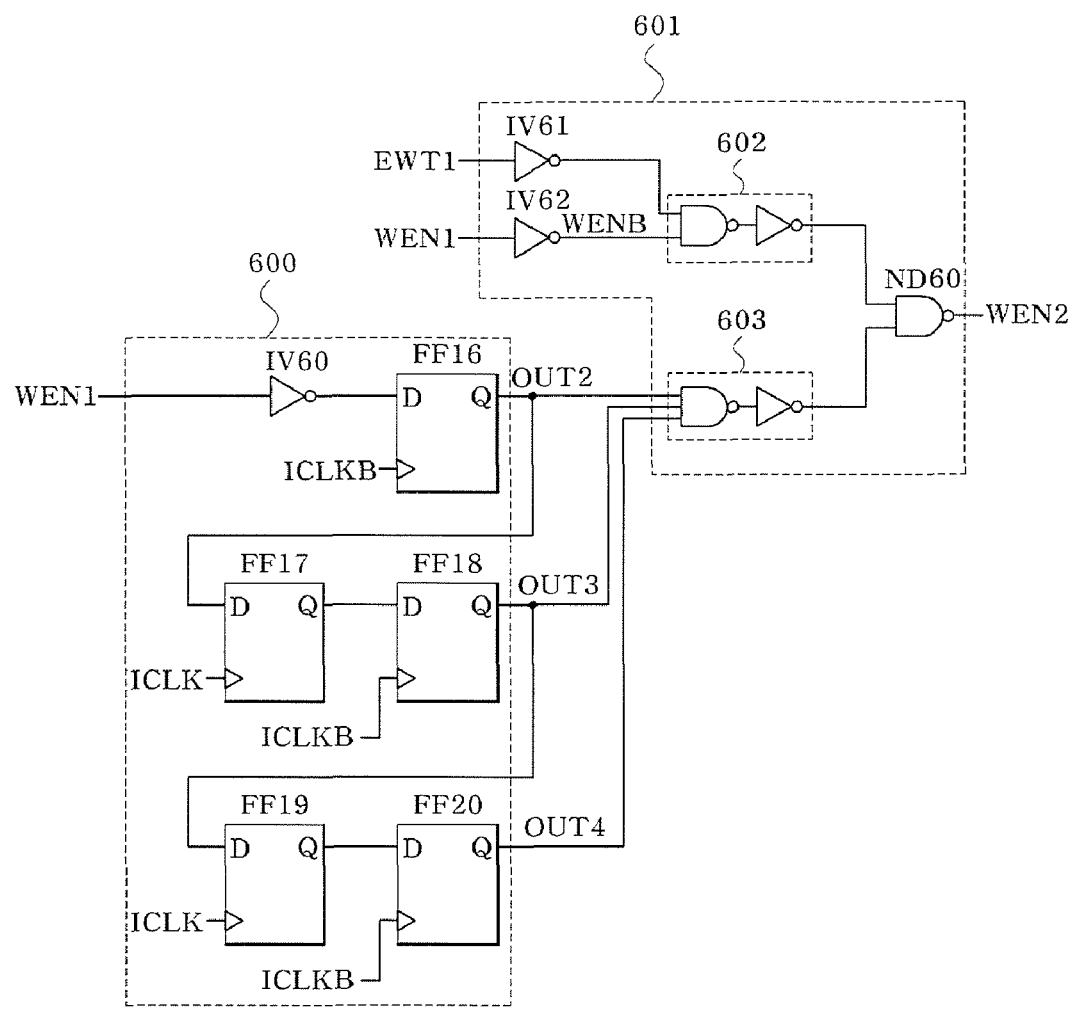
FIG. 8 is a circuit diagram of a write operation maintenance section included in the clock enable signal generation unit of FIG. 7.

As illustrated in FIG. 8, the write operation maintenance section 60 includes an output signal generation block 600 and a write enable signal output block 601. The output signal generation block 600 includes an inverter IV60, a flip-flop FF16, a flip-flop FF17, a flip-flop FF18, a flip-flop FF19, and a flip-flop FF20. The inverter IV60 is configured to invert and buffer the first write enable signal WEN1. The flip-flop FF16 is configured to shift an output signal of the inverter IV60 by a half cycle of the internal clock ICLK in synchronization with the inverted internal clock ICLKB, and generate a second output signal OUT2. The flip-flop FF17 is configured to shift the second output signal OUT2 by a half cycle of the internal clock ICLK in synchronization with the internal clock ICLK. The flip-flop FF18 is configured to shift an output signal of the flip-flop FF17 by a half cycle of the internal clock ICLK in synchronization with the inverted internal clock ICLKB, and generate a third output signal OUT3. The flip-flop FF19 is configured to shift the third output signal OUT3 by a half cycle of the internal clock ICLK in synchronization with the internal clock ICLK. The flip-flop FF20 is configured to shift an output signal of the flip-flop FF19 by a half cycle of the internal clock ICLK in synchronization with the inverted internal clock ICLKB, and generate a fourth output signal OUT4. The write enable signal output block 601 includes inverters IV61 and IV62, logics 602 and 603, and a NAND gate ND60. The first write signal EWT1 is inputted into the inverter IV61 and outputted as the inverted first write signal EWTB1. The first write enable signal WEN1 is inputted into the inverter IV62 and outputted as the inverted first write enable signal WENB1. The write enable signal output block 601 is configured to generate a second write enable signal WEN2 which is enabled to a high level when the first write signal EWT1 is enabled to a high level or the first write enable signal WEN1 is enabled to a high level. The second write enable signal WEN2 generated from the write enable signal output block 601 maintains the enabled state of the high level until two and half cycles of the internal clock ICLK elapse after the first write enable signal WEN1 is enabled to a high level. The second write enable signal WEN2 is a signal which is enabled to a high level in order to maintain the generation of the write clock WCLK until data is transferred to a memory cell in the write operation.

Figure 9:
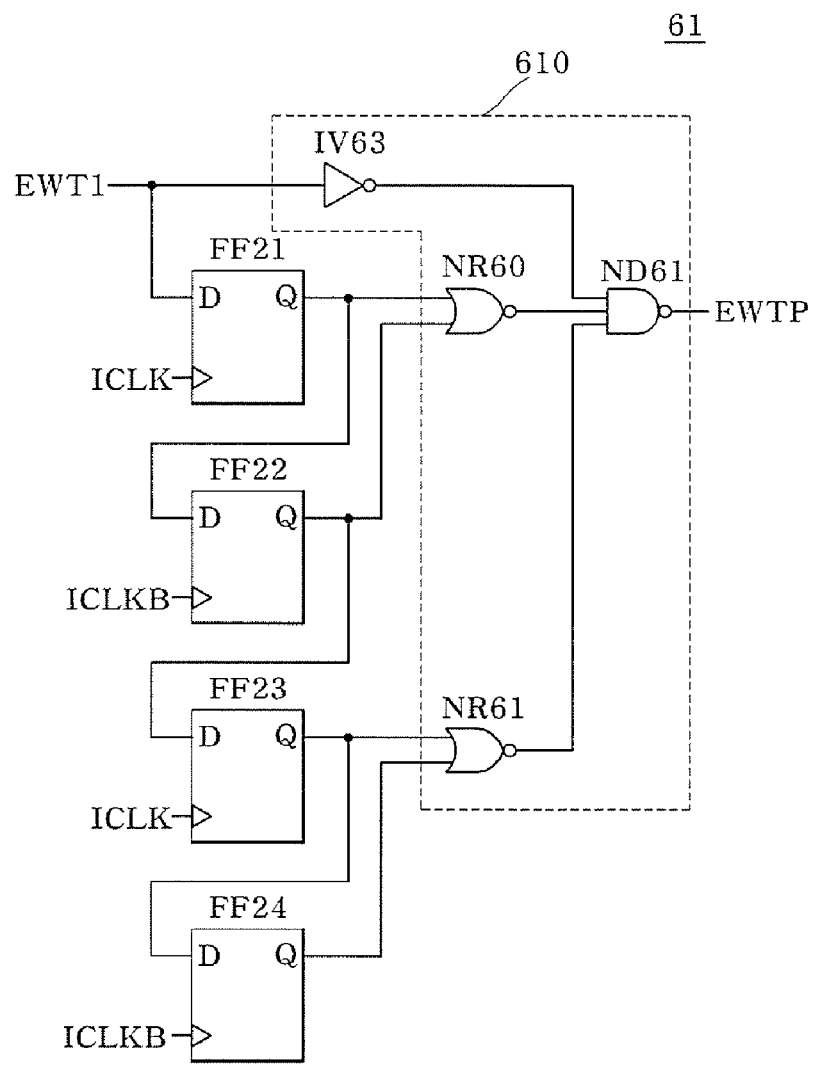
FIG. 9 is a circuit diagram of the malfunction prevention section included in the clock enable signal generation unit of FIG. 7.

As illustrated in FIG. 9, the malfunction prevention section 61 includes flip-flops FF21 to FF24 and a write pulse output block 610. The flip-flops FF21 to FF24 are configured to sequentially shift the write signal EWT1 by a half cycle of the internal clock ICLK. The write pulse output block 610 is configured to generate a write pulse EWTP which is enabled to a high level when the first write signal EWT1 is enabled to a high level or at least one of the output signals of the flip-flops FF21 to FF24 is enabled to a high level. The write pulse EWTP is a signal which is enabled to a high level in order to substantially prevent malfunction when the write command is inputted several times.

Figure 10:
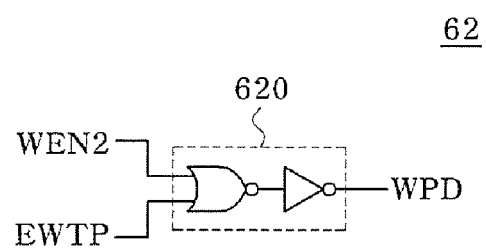
FIG. 10 is a circuit diagram of a write period signal generation section included in the clock enable signal generation unit of FIG. 7.

As illustrated in FIG. 10, the write period signal generation section 62 is configured to generate a write period signal WPD by performing an OR operation on the second write enable signal WEN2 and the write pulse EWTP. The write period signal WPD is enabled to a high level in a time period in which the second write enable signal WEN2 or the write pulse EWTP is enabled to a high level.

Figure 11:
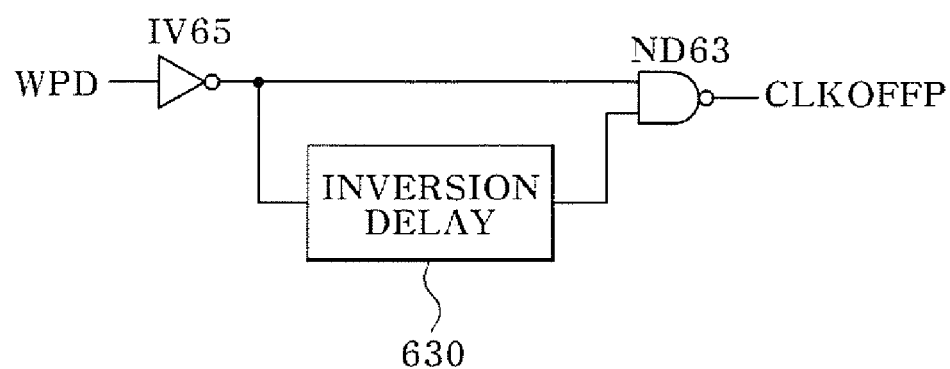
FIG. 11 is a circuit diagram of a clock end pulse generation section included in the clock enable signal generation unit of FIG. 7.

As illustrated in FIG. 11, the clock end pulse generation section 63 includes an inverter IV65, an inversion delay 630, and a NAND gate ND63. The inverter IV65 is configured to invert and buffer the write period signal WPD. The inversion delay 630 is configured to invert and delay an output signal of the inverter IV65 by a predetermined delay time. The NAND gate ND63 is configured to generate a clock end pulse CLKOFFP by performing a NAND operation on the output signal of the inverter IV65 and an output signal of the inversion delay 630. The clock end pulse generation section 63 configured as above generates the clock end pulse CLKOFFP including a pulse having a low level pulse width corresponding to the predetermined delay time of the inversion delay 630 in a time period in which the write period signal WPD changes from a high level to a low level.

Figure 12:
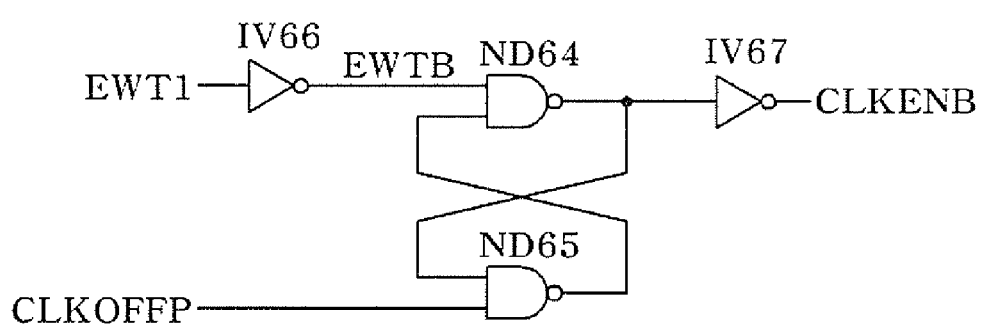
FIG. 12 is a circuit diagram of a clock enable signal output section included in the clock enable signal generation unit of FIG. 7.

As illustrated in FIG. 12, the clock enable signal output section 64 includes an inverter IV66, NAND gates ND64 and ND65, and an inverter IV67. The inverter IV66 is configured to invert and buffer the first write signal EWT1 into the inverted write signal EWTB1. The NAND gates ND64 and ND65 are configured to operate as an SR latch, and the inverter IV67 is configured to invert and buffer an output signal of the SR latch constituted with the NAND gates ND64 and ND65. The clock enable signal output section 64 configured as above generates a clock enable signal CLKENB which is enabled to a low level from a time period in which the first write signal EWT1 is enabled to a high level to a time period in which the a low level pulse of the clock end pulse CLKOFFP is inputted.

Figure 13A:
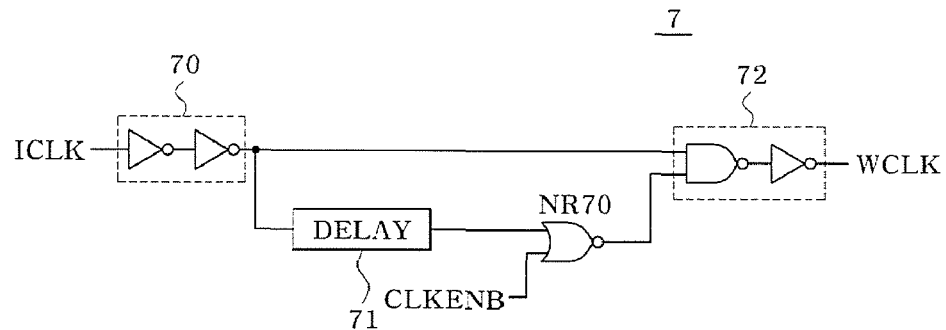
FIGS. 13A to 13C are circuit diagrams a write clock generation unit included in the clock generation circuit of FIG. 1.
Figure 13B:
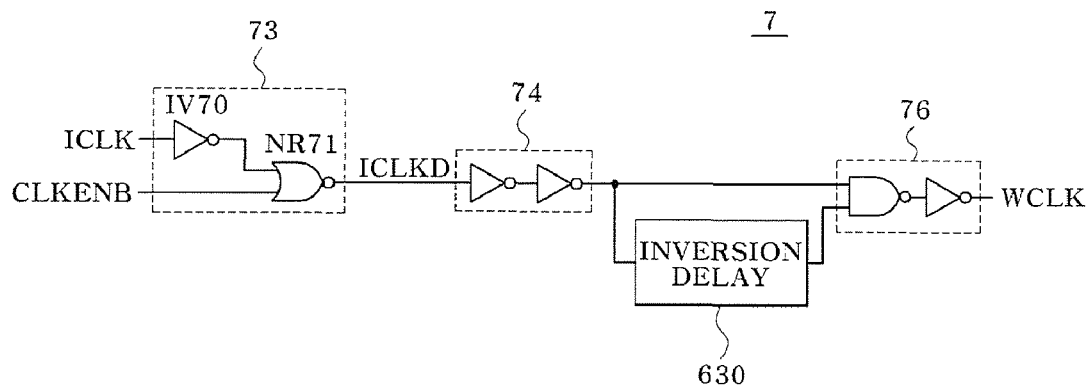
Figure 13C:
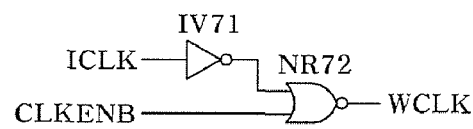

FIGS. 13A to 13C are circuit diagrams of the write clock generation unit included in the clock generation circuit of FIG. 1 according to embodiments of the present invention.

As illustrated in FIG. 13A, the write clock generation unit 7 according to an embodiment of the present invention includes a buffer 70, a delay 71, a NOR gate NR70, and a buffer 72. The buffer 70 is configured to buffer the internal clock ICLK, and the delay 71 is configured to delay an output signal of the buffer 70 by a predetermined delay time. The NOR gate NR70 is configured to operate as a transfer element which transfers an output signal of the delay 71 in response to the clock enable signal CLKENB. The buffer 72 is configured to buffer the output signal of the buffer 70, and output the buffered signal as the write clock WCLK in response to an output signal of the NOR gate NR70.

As illustrated in FIG. 13B, the write clock generation unit 7 according to another embodiment of the present invention includes a transfer element 73, a buffer 74, an inversion delay 75, and a buffer 76. The transfer element 73 is configured to buffer the internal clock ICLK in response to the clock enable signal CLKENB and transfer the buffered internal clock ICLK. The buffer 74 is configured to buffer an output signal of the transfer element 73. The inversion delay 75 is configured to invert and delay an output signal of the buffer 74 by a predetermined delay time. The buffer 76 is configured to buffer the output signal of the buffer 74 and output the buffered signal as the write clock WCLK in response to an output signal of the inversion delay 75.

As illustrated in FIG. 13C, the write clock generation unit 7 according to another embodiment of the present invention includes an inverter IV71 and a NOR gate NR72. The inverter IV71 is configured to invert and buffer the internal clock ICLK, and the NOR gate NR72 is configured to invert and buffer an output signal of the inverter IV71 in response to the clock enable signal CLKENB and to output the write clock WCLK.

The write clock generation unit 7 implemented according to the embodiments of FIGS. 13A to 13C buffers the internal clock ICLK the write clock WCLK and outputs the buffered internal clock ICLK as the write clock WCLK in a time period in which the clock enable signal CLKENB is enabled to a low level.

The operation of the clock generation circuit configured as above will be described below. Specifically, the write operation when the write command is successively inputted in such a state that the burst length is set to 8 will be described below.

Figure 14:
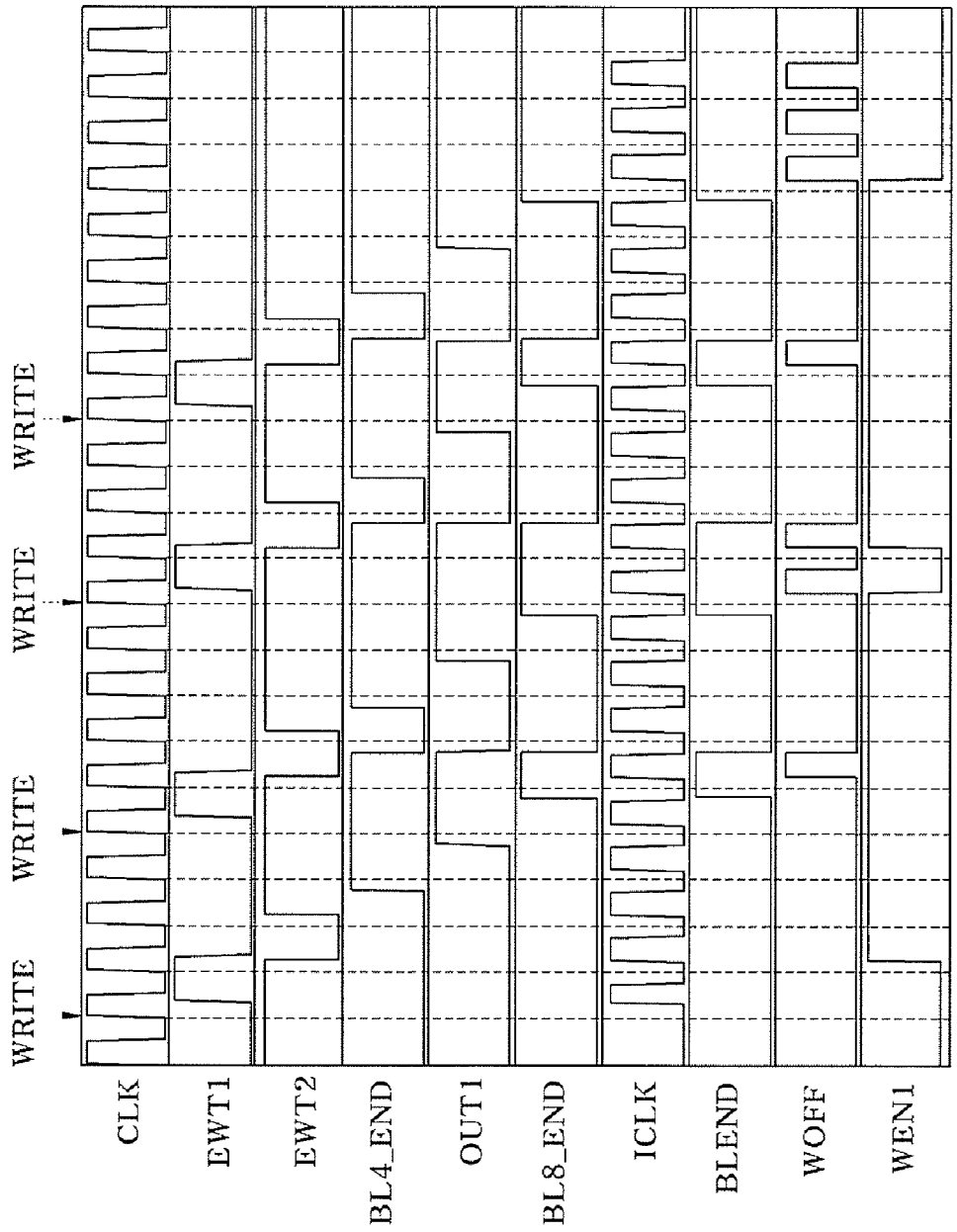
FIGS. 14 and 15 are timing diagrams explaining the operation of the clock generation circuit illustrated in FIG. 1.

The operation of the write enable signal generation unit 5 illustrated in FIG. 2 will be described below in detail with reference to FIG. 14.

First, when the write command WRITE is inputted, a high level pulse of the first write signal EWT1 is generated. The write signal shifting section 50 illustrated in FIG. 3 generates the second write signal EWT2 by shifting the first write signal EWT1 by one cycle of the internal clock ICLK and inverting and buffering the shifted first write signal EWT1.

Next, the burst end signal generation section 51 illustrated in FIG. 4 generates the first burst end signal BL4_END by shifting the second write signal EWT2 by the half cycle of the internal clock ICLK, generates the second burst end signal BL8_END by shifting the first burst end signal BL4_END by two cycles of the internal clock ICLK, and generates the third burst end signal BL16_END by shifting the second burst end signal BL8_END by four cycles of the internal clock ICLK.

Next, the burst end signal selection section 52 illustrated in FIG. 5 receives the second burst signal BL8 enabled to a high level, and outputs the second burst end signal BL8_END as the output burst end signal BLEND.

Next, the write enable signal output section 53 illustrated in FIG. 6 generates the first write enable signal WEN1 which is pull-up driven to a high level in a time period in which the second write signal EWT2 is enabled to a low level, and generates the first write enable signal WEN1 which is pull-down driven to a low level when the write end signal WOFF is enabled to a high level in a time period in which the second write signal EWT2 is disabled to a high level.

Figure 15:
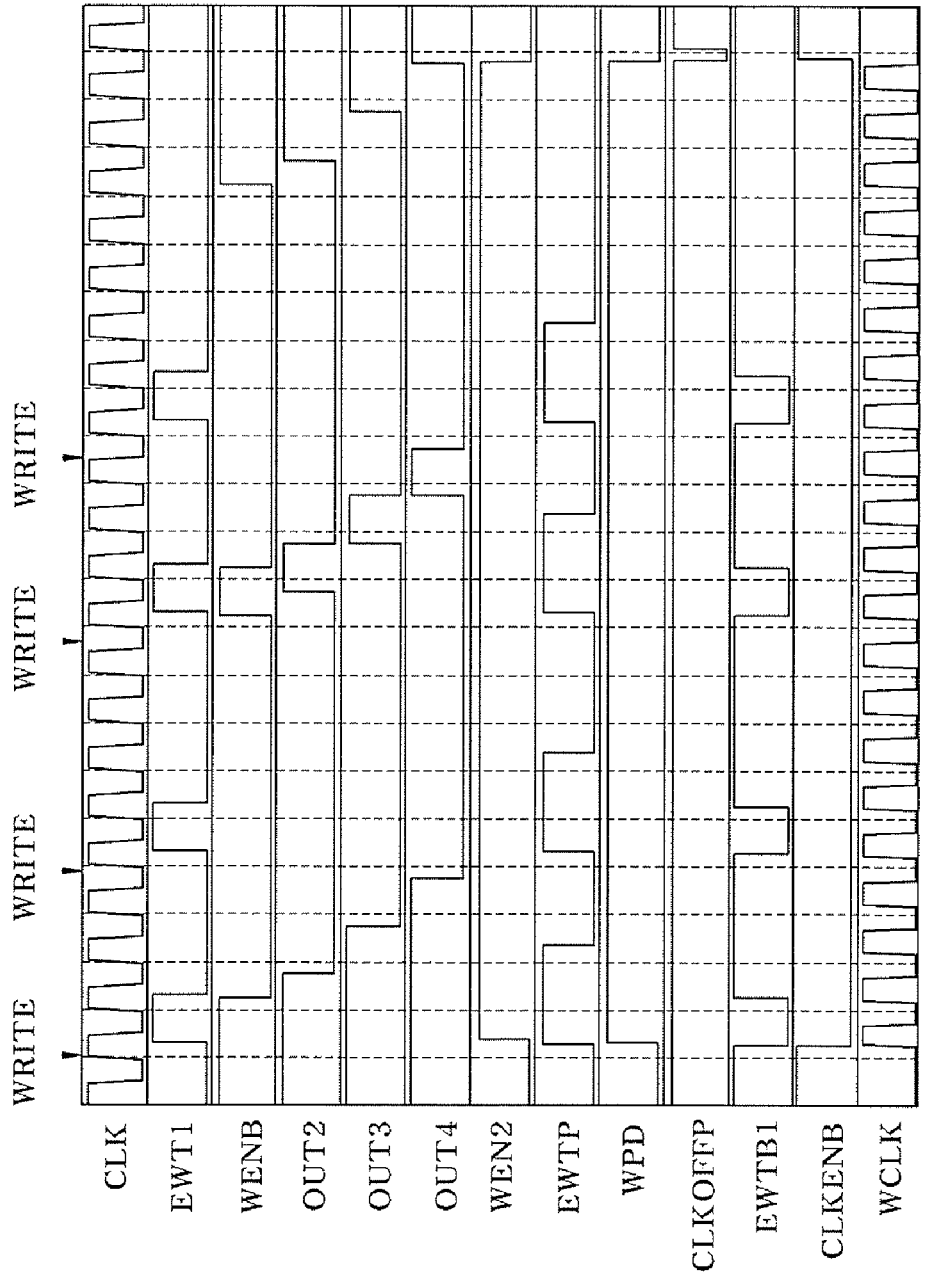

The operation of the clock enable signal generation unit 6 illustrated in FIG. 7 will be described below in detail with reference to FIG. 15.

First, the write operation maintenance section 60 illustrated in FIG. 8 generates the second write enable signal WEN2 which is enabled to a high level when the first write signal EWT1 is enabled to a high level or the first write enable signal WEN1 is enabled to a high level. At this time, the second write enable signal WEN2 generated from the write enable signal output block 601 maintains the enabled state of the high level until two and half cycles of the internal clock ICLK elapse after the first write enable signal WEN1 is enabled to a high level.

Next, the malfunction prevention section 61 illustrated in FIG. 9 generates the write pulse EWTP which is enabled to a high level when the first write enable signal WEN1 is enabled to a high level or at least one of the output signals of the flip-flops FF21 to FF24 is enabled to a high level.

Next, the write period signal generation section 62 illustrated in FIG. 10 generates the write period signal WPD which is enabled to a high level in a time period in which the second write enable signal WEN2 or the write pulse EWTP is enabled to a high level.

Next, the clock end pulse generation section 63 illustrated in FIG. 11 generates the clock end pulse CLKOFFP including the pulse having the low level pulse width corresponding to the delay time of the inversion delay 630 in a time period in which the write period signal WPD changes from a high level to a low level.

Next, the clock enable signal output section 64 illustrated in FIG. 12 generates the clock enable signal CLKENB which is enabled to a low level from a time period in which the first write signal EWT1 is enabled to a high level to a time period in which the low level pulse of the clock end pulse CLKOFFP is inputted.

Next, the write clock generation unit 7 implemented according to various embodiments of FIGS. 13A to 13C buffers the internal clock ICLK and outputs the buffered internal clock ICLK as the write clock WCLK in a time period in which the clock enable signal CLKENB is enabled to a low level.

As described above, the clock generation circuit according to the embodiment of the present invention receives the first write signal EWT1, which is generated in response to the write command WRITE, and the first to third burst signals BL4, BL8 and BL16, which include information on burst length, and generates the clock enable signal CLKENB, which is enabled to a low level only during the write operation. Furthermore, in order for the data input/output operation for the write operation, the clock generation circuit according to the embodiment of the present invention generates the write clock WCLK which is toggled only during the write operation by the clock enable signal CLKENB. Consequently, it is possible to reduce the current consumption which occurs due to the unnecessary data input/output operation during periods other than the write operation period.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A clock control circuit comprising:
    a write enable signal generation unit configured to generate a first write enable signal, which is enabled during a predetermined time period after a write command is inputted, in response to first and second burst signals, and in response to a first write signal generated in response to the write command; and
    a clock enable signal generation unit configured to generate a clock enable signal, which is enabled during a write operation period, in response to the first write signal and the first write enable signal, wherein the clock enable signal is enabled to output an internal clock as a write clock.

2. The clock control circuit of claim 1, wherein the write enable signal generation unit comprises:
    a write signal shifting section configured to shift the first write signal in synchronization with the internal clock and generate a second write signal;
    a burst end signal generation section configured to shift the second write signal in synchronization with the internal clock and generate a first burst end signal and a second burst end signal;
    a burst end signal selection section configured to respectively select either the first or second burst end signal as an output burst end signal in response to either a first or second burst signal; and
    a write enable signal output section configured to drive the first write enable signal in response to the second write signal and the output burst end signal.

3. The clock control circuit of claim 2, wherein the write signal shifting section comprises:
    a flip-flop configured to shift the first write signal in synchronization with the internal clock; and
    a buffer configured to buffer an output signal of the flip-flop and output the second write signal.

4. The clock control circuit of claim 2, wherein the burst end signal generation section comprises:
- a first flip-flop configured to shift the second write signal in synchronization with the internal clock;
- a second flip-flop configured to shift an output signal of the first flip-flop in synchronization with the internal clock;
- a transfer element configured to transfer an output signal of the second flip-flop in response to the second write signal; and
- a third flip-flop configured to shift an output signal of the transfer element in synchronization with the internal clock.

5. The clock control circuit of claim 2, wherein the burst end signal selection section comprises:
- a first transfer element configured to transfer the first burst end signal as the output burst end signal in response to the first burst signal; and
- a second transfer element configured to transfer the second burst end signal as the output burst end signal in response to the second burst signal.

6. The clock control circuit of claim 2, wherein the write enable signal output section comprises:
- a transfer element configured to transfer the output burst end signal as a write end signal in response to the internal clock; and
- a driver configured to drive the first write enable signal in response to the second write signal and the write end signal.

7. The clock control circuit of claim 6, wherein the driver is configured to enable the first write enable signal when the second write signal is enabled, and disable the first write enable signal when the write end signal is enabled.

8. The clock control circuit of claim 1, wherein the clock enable signal generation unit comprises:
- a write operation maintenance section configured to generate a second write enable signal in response to the first write signal and the first write enable signal;
- a malfunction prevention section configured to generate a write pulse in response to the first write signal, which is generated by shifting the first write signal in synchronization with the internal clock;
- a write period signal generation section configured to generate a write period signal in response to the second write enable signal and the write pulse;
- a clock end pulse generation section configured to generate a clock end pulse in response to the write period signal; and
- a clock enable signal output section configured to output the clock enable signal in response to the first write signal and the clock end pulse.

9. The clock control circuit of claim 8, wherein the write operation maintenance section comprises:
- an output signal generation block comprising a plurality of flip-flops configured to output signals that corresponds to shifts of the first write enable signal in synchronization with the internal clock; and
- a write enable signal output block configured to generate the second write enable signal when the first write signal, the first write enable signal, and at least one of output signals of the output signal generation block are received by the write enable signal output block.

10. The clock control circuit of claim 8, wherein the malfunction prevention section comprises:
- a first flip-flop configured to shift the first write signal in synchronization with the internal clock;
- a second flip-flop configured to shift an output signal of the first flip-flop in synchronization with the internal clock; and
- a write pulse output block configured to generate the write pulse when the first write signal and at least one of output signals of the first and second flip-flops are received by the write pulse output block.

11. The clock control circuit of claim 8, wherein the write period signal generation section is configured to generate the write period signal when the second write enable signal or the write pulse is inputted.

12. The clock control circuit of claim 8, wherein the clock end pulse generation section is configured to generate a clock end pulse including a pulse which is generated in a time period in which an enable period of the write period signal is ended.

13. The clock control circuit of claim 12, wherein the clock end pulse generation section comprises:
- a buffer configured to buffer the write period signal;
- an inversion delay configured to invert and delay an output signal of the buffer by a predetermined delay time; and
- a logic configured to perform a logic operation on the output signal of the buffer and an output signal of the inversion delay.

14. The clock control circuit of claim 8, wherein the clock enable signal output section is configured to enable the clock enable signal when the first write signal is enabled, and disable the clock enable signal when the clock end pulse is inputted.

15. A clock generation circuit comprising:
- a command decoder configured to generate a first write signal in response to a write command;
- a mode register configured to store first and second burst signals including information on burst length;
- a clock control circuit configured to generate a clock enable signal in response to the first write signal and the first and second burst signals; and
- a write clock generation unit configured to output an internal clock as a write clock when the clock enable signal is enabled.

16. The clock generation circuit of claim 15, wherein the write clock generation unit comprises:
- a first buffer configured to buffer the internal clock;
- a delay unit configured to delay an output signal of the first buffer by a predetermined delay time;
- a transfer element configured to transfer the delayed output signal of the delay unit in response to the clock enable signal; and
- a second buffer configured to buffer the output signal of the first buffer and to output the write clock in response to an output signal of the transfer element.

17. The clock generation circuit of claim 15, wherein the write clock generation unit comprises:
- a transfer element configured to buffer the internal clock in response to the clock enable signal;
- a first buffer configured to buffer an output signal of the transfer element;
- an inversion delay configured to invert and delay an output signal of the first buffer by a predetermined delay time; and
- a second buffer configured to buffer the output signal of the first buffer and output the write clock in response to an output signal of the inversion delay.

18. The clock generation circuit of claim 15, wherein the write clock generation unit comprises:
- a first buffer configured to buffer the internal clock as an output signal; and a transfer element configured to output the write clock in response to the clock enable signal and to the output signal of the first buffer.

19. The clock generation circuit of claim 15, wherein the clock control circuit comprises:
a write enable signal generation unit configured to generate a first write enable signal in response to first write signal and the first and second burst signals, such that the write enable signal generation unit is enabled during a predetermined time period after the write command is inputted; and
a clock enable signal generation unit configured to generate the clock enable signal in response to the first write signal and the first write enable signal.

20. The clock generation circuit of claim 19, wherein the write enable signal generation unit comprises:
a write signal shifting section configured to generate a second write signal by shifting the first write signal in synchronization with the internal clock;
a burst end signal generation section configured to shift the second write signal in synchronization with the internal clock and generate a first burst end signal and a second burst end signal;
a burst end signal selection section configured to respectively select the first burst end signal or the second burst end signal as an output burst end signal in response to the first and second burst signals; and
a write enable signal output section configured to output the first write enable signal in response to the second write signal and to the output burst end signal.

21. The clock generation circuit of claim 20, wherein the write signal shifting section comprises:
a flip-flop configured to shift the first write signal in synchronization with the internal clock; and
a buffer configured to buffer an output signal of the flip-flop and to output the second write signal.

22. The clock generation circuit of claim 20, wherein the burst end signal generation section comprises:
a first flip-flop configured to shift the second write signal by a half cycle of an internal clock in synchronization with an inverted internal clock;
a second flip-flop configured to shift an output signal of the first flip-flop in synchronization with the internal clock;
a transfer element configured to transfer an output signal of the second flip-flop in response to the second write signal; and
a third flip-flop configured to shift an output signal of the transfer element in synchronization with the internal clock.

23. The clock generation circuit of claim 20, wherein the burst end signal selection section comprises:
a first transfer element configured to transfer the first burst end signal as the output burst end signal in response to the first burst signal; and
a second transfer element configured to transfer the second burst end signal as the output burst end signal in response to the second burst signal.

24. The clock generation circuit of claim 20, wherein the write enable signal output section comprises:
a transfer element configured to transfer the output burst end signal as a write end signal in response to the internal clock; and
a driver configured to output the first write enable signal in response to the second write signal and the write end signal.

25. The clock generation circuit of claim 24, wherein the driver is configured to enable the first write enable signal when the second write signal is enabled, and configured to disable the first write enable signal when the write end signal is enabled.

26. The clock generation circuit of claim 19, wherein the clock enable signal generation unit comprises:
a write operation maintenance section configured to generate a second write enable signal in response to the first write signal and the first write enable signal;
a malfunction prevention section configured to generate a write pulse in response to the first write signal and the first write signal shifted in synchronization with the internal clock;
a write period signal generation section configured to generate a write period signal in response to the second write enable signal and the write pulse;
a clock end pulse generation section configured to generate a clock end pulse in response to the write period signal; and
a clock enable signal output section configured to output the clock enable signal in response to the first write signal and the clock end pulse.

27. The clock generation circuit of claim 26, wherein the write operation maintenance section comprises:
an output signal generation block comprising a plurality of flip-flops configured to output signals by shifting the first write enable signal in synchronization with the internal clock; and
a write enable signal output block configured to generate the second write enable signal when the first write signal, the first write enable signal, and at least one of output signals of the output signal generation block are received.

28. The clock generation circuit of claim 26, wherein the malfunction prevention section comprises:
a first flip-flop configured to shift the first write signal in synchronization with the internal clock;
a second flip-flop configured to shift an output signal of the first flip-flop in synchronization with the internal clock; and
a write pulse output block configured to generate the write pulse when the first write signal and at least one of output signals of the first and second flip-flops are received.

29. The clock generation circuit of claim 26, wherein the write period signal generation section is configured to generate the write period signal in a time period when the second write enable signal is enabled or the write pulse is inputted.

30. The clock generation circuit of claim 26, wherein the clock end pulse generation section is configured to generate a clock end pulse including a pulse which is generated in a time period in which an enable period of the write period signal is ended.

31. The clock generation circuit of claim 26, wherein the clock end pulse generation section comprises:
a buffer configured to buffer the write period signal;
an inversion delay configured to invert and delay an output signal of the buffer by a predetermined delay time; and
a logic unit configured to generate a clock end pulse by performing a logic operation on the output signal of the buffer and an output signal of the inversion delay.

32. The clock generation circuit of claim 26, wherein the clock enable signal output section is configured to output the clock enable signal when the first write signal and the clock end pulse are inputted.

* * * * *